United States Patent
Kim

(10) Patent No.: US 10,199,079 B2
(45) Date of Patent: Feb. 5, 2019

(54) SEMICONDUCTOR MEMORY DEVICE

(71) Applicant: SK hynix Inc., Icheon-si, Gyeonggi-do (KR)

(72) Inventor: Myung Jin Kim, Icheon-si (KR)

(73) Assignee: SK hynix Inc., Icheon-si, Gyeonggi-do (KR)

(*) Notice: Subject to any disclaimer, the term of this patent is extended or adjusted under 35 U.S.C. 154(b) by 0 days.

(21) Appl. No.: 15/701,917

(22) Filed: Sep. 12, 2017

(65) Prior Publication Data

US 2018/0240506 A1    Aug. 23, 2018

(30) Foreign Application Priority Data

Feb. 21, 2017  (KR) .................. 10-2017-0023052

(51) Int. Cl.
| | |
|---|---|
| *G11C 7/10* | (2006.01) |
| *G11C 5/14* | (2006.01) |
| *G11C 5/02* | (2006.01) |
| *G11C 16/26* | (2006.01) |
| *G11C 8/16* | (2006.01) |

(52) U.S. Cl.
CPC .............. *G11C 7/106* (2013.01); *G11C 5/025* (2013.01); *G11C 5/146* (2013.01); *G11C 7/1006* (2013.01); *G11C 7/1075* (2013.01); *G11C 16/26* (2013.01); *G11C 8/16* (2013.01); *G11C 2207/105* (2013.01); *G11C 2207/107* (2013.01); *G11C 2207/108* (2013.01)

(58) Field of Classification Search
CPC ......... G11C 16/08; G11C 7/1072; G11C 7/00; G11C 7/222
See application file for complete search history.

(56) References Cited

U.S. PATENT DOCUMENTS

| | | | |
|---|---|---|---|
| 2007/0067556 A1* | 3/2007 | Dixon ................. | G06F 11/106 711/106 |
| 2013/0003480 A1* | 1/2013 | D'Abreu ............. | G06F 13/1668 365/218 |
| 2013/0159766 A1* | 6/2013 | D'Abreu ............. | G06F 12/0246 714/6.3 |

FOREIGN PATENT DOCUMENTS

| | | |
|---|---|---|
| KR | 101213175 B1 | 12/2012 |
| KR | 1020150136891 A | 12/2015 |

* cited by examiner

*Primary Examiner* — Uyen B Tran
(74) *Attorney, Agent, or Firm* — William Park & Associates Ltd.

(57) ABSTRACT

A semiconductor memory device may include a memory cell array area, a peripheral area, and an interface area. The memory cell array area may include at least one memory plane. The peripheral area may be formed adjacent to one side of the memory cell array area. The interface area may be formed adjacent to one side of the peripheral area and include a plurality of data input/output pads. The peripheral area may include a data path logic area formed between the memory cell array area and the interface area. The interface area may include at least one SerDes (serializer/deserializer) area configured to transmit, to the memory cell array area, data inputted through the data input/output pads, or output, through the data input/output pads, data received from the memory cell array.

12 Claims, 12 Drawing Sheets

SEMICONDUCTOR MEMORY DEVICE

CROSS-REFERENCE TO RELATED APPLICATION

The present application claims priority under 35 U.S.C. § 119(a) to Korean patent application number 10-2017-0023052 filed on Feb. 21, 2017 in the Korean Intellectual Property Office, the entire disclosure of which is incorporated herein by reference.

BACKGROUND

1. Technical Field

Various embodiments of the present disclosure generally relate to an electronic device, and more particularly, to a semiconductor memory device.

2. Related Art

Semiconductor memory devices are memory devices realized using a semiconductor including material such as silicon (Si), germanium (Ge), gallium arsenide (GaAs), indium phosphide (InP), or the like. Semiconductor memory devices are classified into volatile memory devices and nonvolatile memory devices.

The volatile memory device is a memory device in which data stored therein is lost when power is turned off. Representative examples of a volatile memory device include a static RAM (SRAM), a dynamic RAM (DRAM), a synchronous DRAM (SDRAM), etc. The nonvolatile memory device is a memory device in which data stored therein is maintained even when power is turned off. Representative examples of a nonvolatile memory device include a read-only memory (ROM), a programmable ROM (PROM), an electrically programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FRAM), etc. The flash memory may be classified into a NOR type memory and a NAND type memory.

SUMMARY

Various embodiments of the present disclosure are directed to a semiconductor memory device capable of reducing the production cost, and reducing the size of a chip.

An embodiment of the present disclosure may provide for a semiconductor memory device including: a memory cell array area including at least one memory plane; a peripheral area formed adjacent to one side of the memory cell array area; and an interface area formed adjacent to one side of the peripheral area, the interface area comprising a plurality of data input/output pads. The peripheral area may include a data path logic area formed between the memory cell array area and the interface area. The interface area may include at least one SerDes (serializer/deserializer) area configured to transmit, to the memory cell array area, data inputted through the data input/output pads, or output, through the data input/output pads, data received from the memory cell array.

DETAILED DESCRIPTION

Figure 1:
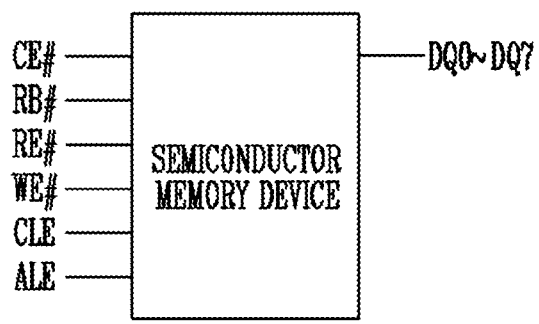
FIG. 1 is a diagram illustrating a pin configuration of the semiconductor memory device.

Hereinafter, embodiments in accordance with the present disclosure will be described in detail with reference to the accompanying drawings. Reference is now made to the drawings, in which the same reference numerals are used throughout the different drawings to designate the same or similar components. Details of well-known configurations and functions may be omitted to avoid unnecessarily obscuring the present disclosure.

FIG. 1 is a diagram illustrating a pin configuration of a semiconductor memory device.

Referring to FIG. 1, the semiconductor memory device 100 may communicate with an external controller through a plurality of lines.

The semiconductor memory device 100 may communicate with the controller through a chip enable (CE#) line, a command latch enable (CLE) line, an address latch enable (ALE) line, a write enable (WE#) line, a read enable (RE#) line, a ready/busy (RB#) line, and data input/output (DQ0 to DQ7) lines.

The chip enable (CE#) line refers to a signal indicating that the corresponding semiconductor memory device 100 is operable. A signal of the chip enable (CE#) line may be selectively applied to storage devices coupled to the same channel. When the signal of the chip enable (CE#) line drops to a low level, this indicates that all operations in a corresponding chip are possible. When the signal of the chip enable (CE#) line is in a high level, the corresponding chip may be in a standby state.

When a ready/busy (RB#) line signal drops to a low level while an operation in the chip is performed, the chip is not allowed to exchange another signal with an external device. When the ready/busy (RB#) line signal is in a high level, this indicates that the chip is in a ready state.

A command latch enable signal CLE becomes a high level while a command CMD is inputted to a storage device. An address latch enable signal ALE becomes a high level while an address ADD is inputted to a storage device.

The command CMD and the address ADD are inputted to a selected storage device when a write enable signal WE# makes a transition from a high level to a low level.

A write enable signal WE# is toggled when the command and address is loaded on the storage device. A read enable signal RE# is toggled when data is loaded on the controller.

The data input/output (DQ0 to DQ7) lines are used for inputting a command, an address, and data to the semiconductor memory device 100 or outputting data from the semiconductor memory device 100 to the controller. Because data is 8-bit data, eight data input/output (DQ0 to DQ7) lines are provided. However, the number of the data input/output lines is not limited to eight, and it may be expanded to sixteen or thirty-two in various embodiments.

Figure 2:
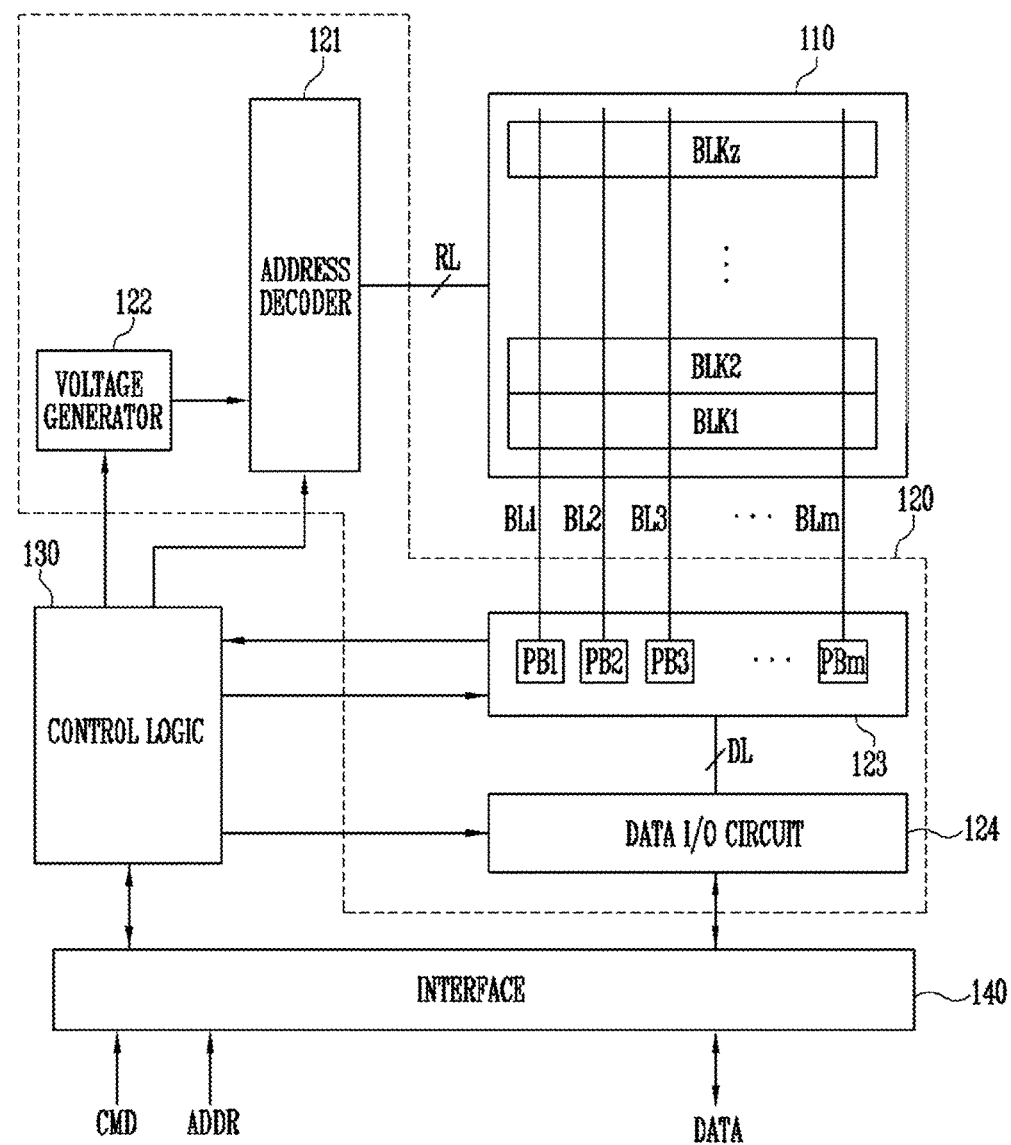
FIG. 2 is a block diagram illustrating the structure of the semiconductor memory device of FIG. 1.

FIG. 2 is a block diagram illustrating a configuration of the semiconductor memory device 100 of FIG. 1.

Referring to FIG. 2, the semiconductor memory device 100 may include a memory cell array 110, a peripheral circuit 120, a control logic 130, and an interface 140.

The memory cell array 110 may be coupled to an address decoder 121 through source select lines SSL, word lines WL, and drain select lines DSL, and may be coupled to an read/write circuit 123 through bit lines BL.

The memory cell array 110 includes a plurality of memory blocks BLK1 to BLKz. The plurality of memory blocks BLK1 to BLKz are coupled to the address decoder 121 through row lines RL. The memory blocks BLK1 to BLKz are coupled to the read/write circuit 123 through bit lines BL1 to BLm. Each of the memory blocks BLK1 to BLKz includes a plurality of memory cells. In an embodiment, the plurality of memory cells may be nonvolatile memory cells. Memory cells coupled to the same word line among the plurality of memory cells are defined as one page. In other words, the memory cell array 110 is formed of a plurality of pages.

In an embodiment, the memory cell array 110 may include at least one memory plane. Each memory plane may include a plurality of memory blocks. The memory plane included in the memory cell array 110 will be described later with reference to FIG. 5.

Each of the memory cells of the semiconductor memory device 100 may be formed of a single level cell (SLC) capable of storing a single data bit, a multi-level cell (MLC) capable of storing two data bits, a triple-level cell (TLC) capable of storing three data bits, or a quad-level cell (QLC) capable of storing four data bits.

The peripheral circuit 120 may include the address decoder 121, a voltage generator 122, the read/write circuit 123, and a data input/output circuit 124.

The peripheral circuit 120 may drive the memory cell array 110. For example, the peripheral circuit 120 may drive the memory cell array 110 to perform a program operation, a read operation, or an erase operation.

The address decoder 121 is coupled to the memory cell array 110 through the row lines RL. The address decoder 121 may operate under control of the control logic 130. The address decoder 121 may receive addresses ADDR from the control logic 130 through an input/output buffer (not shown) included in the semiconductor memory device 100.

The address decoder 121 may decode a block address among the received addresses ADDR. The address decoder 121 selects a corresponding one of the memory blocks BLK1 to BLKz according to the decoded block address. The address decoder 121 may decode a row address among the received addresses ADDR. The address decoder 121 may select at least one word line WL of the selected memory block by applying voltages supplied from the voltage generator 122 to the at least one word line WL according to the decoded row address.

During a program operation, the address decoder 121 may apply a program voltage to a selected word line and apply a pass voltage having a lower level than that of the program voltage to unselected word lines. During a program verify operation, the address decoder 121 may apply a verification voltage to a selected word line and apply a verification pass voltage higher than the verification voltage to unselected word lines.

During a read operation, the address decoder 121 may apply a read voltage to a selected word line and apply a pass voltage higher than the read voltage to unselected word lines.

In an embodiment, an erase operation of the semiconductor memory device 100 is performed on a memory block basis. During an erase operation, an address ADDR to be inputted to the semiconductor memory device 100 includes a block address. The address decoder 121 may decode the block address and select a corresponding one memory block according to the decoded block address. During an erase operation, the address decoder 121 may apply a ground voltage to word lines coupled to the selected memory block.

In an embodiment, the address decoder 121 may decode a column address among the received addresses ADDR. A decoded column address DCA may be transmitted to the read/write circuit 123. In an embodiment, the address decoder 121 may include components such as a row decoder, a column decoder, and an address buffer.

The voltage generator 122 may generate a plurality of voltages using an external supply voltage provided to the semiconductor memory device 100. The voltage generator 122 may operate under control of the control logic 130.

In an embodiment, the voltage generator 122 may produce an internal supply voltage by regulating the external supply voltage. The internal supply voltage generated by the voltage generator 122 is used as an operating voltage for the semiconductor memory device 100.

In an embodiment, the voltage generator 122 may generate a plurality of voltages using the external supply voltage or the internal supply voltage. The voltage generator 122 may generate various voltages required by the semiconductor memory device 100. For example, the voltage generator 122 may generate a plurality of program voltages, a plurality of pass voltages, a plurality of select read voltages, and a plurality of unselect read voltages.

For example, the voltage generator 122 may include a plurality of pumping capacitors for receiving the internal supply voltage, and generate a plurality of voltages by selectively enabling the plurality of pumping capacitors under control of the control logic 130.

The generated voltages may be supplied to the memory cell array 110 by the address decoder 121.

The read/write circuit 123 includes first to m-th page buffers PB1 to PBm. The first to m-th page buffers PB1 to PBm are coupled to the memory cell array 110 through the first to m-th bit lines BL1 to BLm, respectively. The first to m-th page buffers PB1 to PBm may operate under control of the control logic 130.

The first to m-th page buffers PB1 to PBm may perform data communication with the data input/output circuit 124. During a program operation, the first to m-th page buffers PB1 to PBm receive data DATA to be stored through the data input/output circuit 124 and data lines DL.

During a program operation, the first to m-th page buffers PB1 to PBm may transmit the data DATA, received through the data input/output circuit 124, to selected memory cells through the bit lines BL1 to BLm when a program pulse is applied to a selected word line. The memory cells in the selected page are programmed based on the transmitted data DATA. Memory cells coupled to a bit line to which a program permission voltage (e.g. a ground voltage) is applied may have increased threshold voltages. Threshold voltages of memory cells coupled to a bit line to which a program inhibit voltage (for example, a supply voltage) is applied may be retained. During a program verify operation, the first to m-th page buffers PB1 to PBm read page data from selected memory cells through the bit lines BL1 to BLm.

During a read operation, the read/write circuit 123 reads data DATA from the memory cells in the selected page through the bit lines BL, and outputs the read data DATA to the data input/output circuit 124.

During an erase operation, the read/write circuit 123 may float the bit lines BL. In an embodiment, the read/write circuit 123 may include a column select circuit.

The data input/output circuit 124 is coupled to the first to m-th page buffers PB1 to PBm through the data lines DL. The data input/output circuit 124 may operate under control of the control logic 130. During a program operation, the data input/output circuit 124 receives data DATA to be stored from an external controller (not shown). During a read operation, the data input/output circuit 124 outputs data, received from the first to m-th page buffers PB1 to PBm included in the read/write circuit 123, to the external controller.

The control logic 130 may be coupled to the address decoder 121, the voltage generator 122, the read/write circuit 123, and the data input/output circuit 124. The control logic 130 may control the overall operation of the semiconductor memory device 100. The control logic 130 may operate in response to a command CMD transmitted from an external device.

The interface 140 may provide a data communication interface between the semiconductor memory device 100 and the external device. The interface may include a NAND interface or a NOR interface depending on the type of the semiconductor memory device 100.

Figure 3:
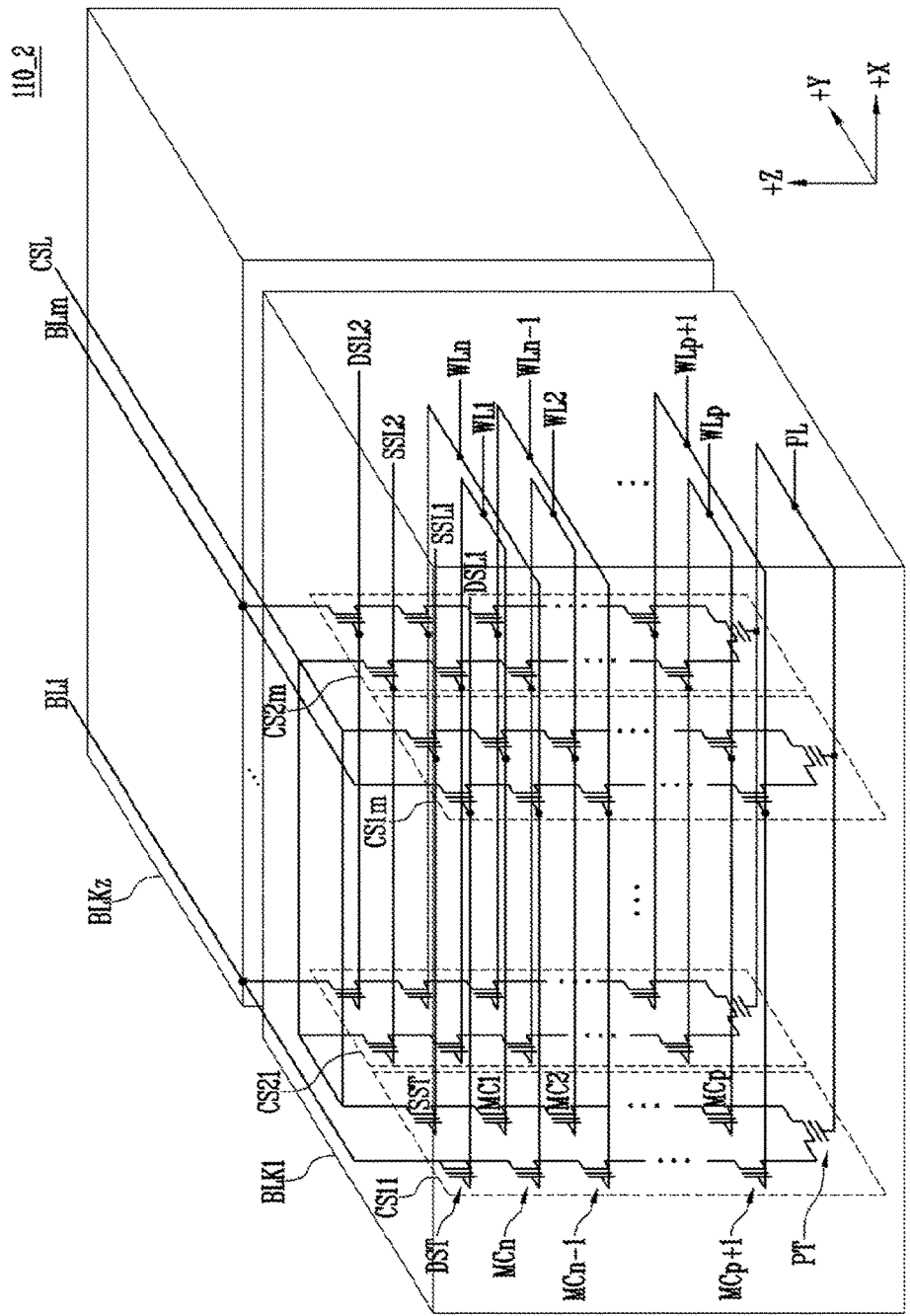
FIG. 3 is a diagram illustrating an embodiment of the memory cell array of FIG. 2.

FIG. 3 is a diagram illustrating an embodiment of the memory cell array 110 of FIG. 2.

Referring to FIG. 3, a memory cell array 110_2 includes a plurality of memory blocks BLK1 to BLKz. In FIG. 3, for the sake of description, the internal configuration of the first memory block BLK1 is illustrated, and the internal configuration of the other memory blocks BLK2 to BLKz are omitted. It will be understood that each of the second to z-th memory blocks BLK2 to BLKz has substantially the same configuration as that of the first memory block BLK1.

Referring to FIG. 3, the first memory block BLK1 includes a plurality of cell strings CS11 to CS1m and CS21 to CS2m. In an embodiment, each of the cell strings CS11 to CS1m and CS21 to CS2m may be formed in a 'U' shape. In the first memory block BLK1, m cell strings are arranged in a row direction (i.e. a positive (+) X direction). In FIG. 3, two cell strings are illustrated as being arranged in a column direction (i.e. a positive (+) Y direction). However, this illustration is made for convenience of description, and it will be understood that three or more cell strings may be arranged in the column direction.

Each of the plurality of cell strings CS11 to CS1m and CS21 to CS2m includes at least one source select transistor SST, first to n-th memory cells MC1 to MCn, a pipe transistor PT, and at least one drain select transistor DST.

The select transistors SST and DST and the memory cells MC1 to MCn may have similar structures. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided to each cell string. In an embodiment, a pillar for providing at least one of the channel layer, the tunneling insulating layer, the charge storage layer, and the blocking insulating layer may be provided to each cell string.

The source select transistor SST of each cell string is coupled between the common source line CSL and the memory cells MC1 to MCp.

In an embodiment, source select transistors of cell strings arranged in the same row are coupled to a source select line extending in a row direction, and source select transistors of cell strings arranged in different rows are coupled to different source select lines. In FIG. 3, source select transistors of cell strings CS11 to CS1m in a first row are coupled to a first source select line SSL1. Source select transistors of cell strings CS21 to CS2m in a second row are coupled to a second source select line SSL2.

In an embodiment, source select transistors of the cell strings CS11 to CS1m and CS21 to CS2m may be coupled in common to a single source select line.

The first to n-th memory cells MC1 to MCn in each cell string are coupled between the source select transistor SST and the drain select transistor DST.

The first to n-th memory cells MC1 to MCn may be divided into first to p-th memory cells MC1 to MCp and p+1-th to n-th memory cells MCp+1 to MCn. The first to p-th memory cells MC1 to MCp are successively arranged in a direction opposite to a positive (+) Z direction and are coupled in series between the source select transistor SST and the pipe transistor PT. The p+1-th to n-th memory cells MCp+1 to MCn are successively arranged in the +Z direction and are coupled in series between the pipe transistor PT and the drain select transistor DST. The first to p-th memory cells MC1 to MCp and the p+1-th to n-th memory cells MCp+1 to MCn are coupled to each other through the pipe transistor PT. The gates of the first to n-th memory cells MC1 to MCn of each cell string are coupled to first to n-th word lines WL1 to WLn, respectively.

In an embodiment, at least one of the first to n-th memory cells MC1 to MCn may be used as a dummy memory cell. When the dummy memory cell is provided, the voltage or current of the corresponding cell string may be stably controlled. Thereby, the reliability of data stored in the memory block BLK1 is improved.

The gates of the respective pipe transistors PT of the cell strings are coupled to a pipeline PL.

The drain select transistor DST of each cell string is coupled between the corresponding bit line and the memory cells MCp+1 to MCn. The cell strings arranged in the row direction are coupled to drain select lines extending in the row direction. Drain select transistors of the cell strings CS11 to CS1m in the first row are coupled to a first drain select line DSL1. Drain select transistors of the cell strings CS21 to CS2m in the second row are coupled to a second drain select line DSL2.

Cell strings arranged in the column direction are coupled to bit lines extending in the column direction. Memory cells coupled to the same word line in cell strings arranged in the row direction form a single page. For example, memory cells coupled to the first word line WL1, among the cell strings CS11 to CS1m in the first row, form a single page. Memory cells coupled to the first word line WL1, among the cell strings CS21 to CS2m in the second row, form another single page. Cell strings arranged in the direction of a single row may be selected by selecting any one of the drain select lines DSL1 and DSL2. One page may be selected from the selected cell strings by selecting any one of the word lines WL1 to WLn.

Figure 4:
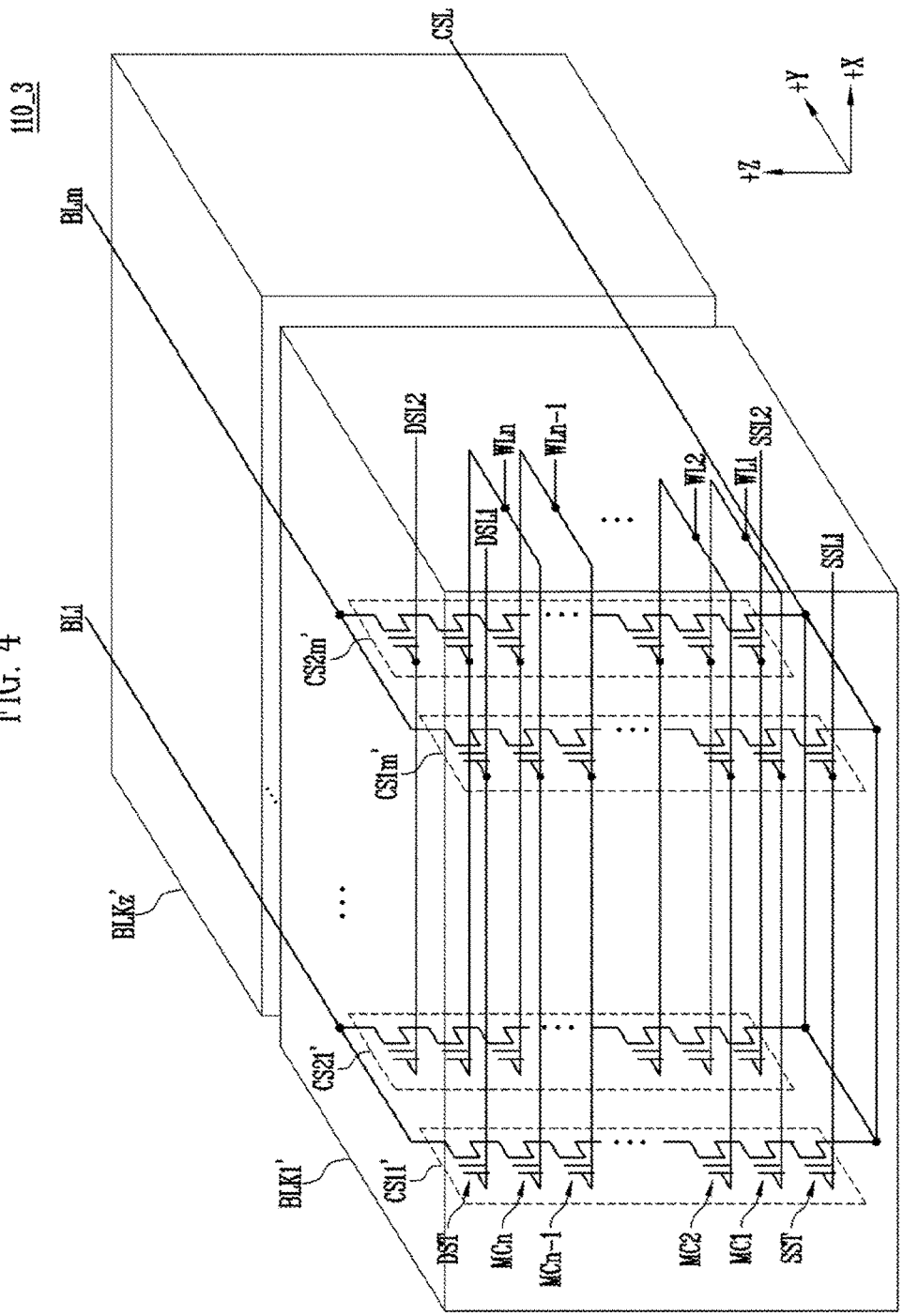
FIG. 4 is a diagram illustrating an embodiment of the memory cell array of FIG. 2.

FIG. 4 is a diagram illustrating an embodiment of the memory cell array 110 of FIG. 2.

Referring to FIG. 4, a memory cell array 110_3 includes a plurality of memory blocks BLK1' to BLKz'. In FIG. 4, for the sake of description, the internal configuration of the first memory block BLK1' is illustrated, and the internal configuration of the other memory blocks BLK2' to BLKz' is omitted. It will be understood that each of the second to z-th memory blocks BLK2' to BLKz' has the same configuration as that of the first memory block BLK1'.

The first memory block BLK1' includes a plurality of cell strings CS11' to CS1m' and CS21' to CS2m'. Each of the plurality of cell strings CS11' to CS1m' and CS21' to CS2m' extends in a positive (+) Z direction. In the first memory block BLK1, m cell strings are arranged in the +X direction. In FIG. 4, two cell strings are illustrated as being arranged in a +Y direction. However, this illustration is made for convenience of description, and it will be understood that three or more cell strings may be arranged in the column direction.

Each of the cell strings CS11' to CS1m' and CS21' to CS2m' includes at least one source select transistor SST, first to n-th memory cells MC1 to MCn, and at least one drain select transistor DST.

The source select transistor SST of each cell string is coupled between the common source line CSL and the memory cells MC1 to MCn. The source select transistors of cell strings arranged in the same row are coupled to the same source select line. Source select transistors of cell strings CS11' to CS1m' arranged in a first row are coupled to a first source select line SSL1. Source select transistors of cell strings CS21' to CS2m' arranged in a second row are coupled to a second source select line SSL2. In an embodiment, source select transistors of the cell strings CS11' to CS1m' and CS21' to CS2m' may be coupled in common to a single source select line.

The first to n-th memory cells MC1 to MCn in each cell string are coupled in series between the source select transistor SST and the drain select transistor DST. Gates of the first to n-th memory cells MC1 to MCn are respectively coupled to first to n-th word lines WL1 to WLn.

In an embodiment, at least one of the first to n-th memory cells MC1 to MCn may be used as a dummy memory cell. When the dummy memory cell is provided, the voltage or current of the corresponding cell string may be stably controlled. Thereby, the reliability of data stored in the memory block BLK1' is improved.

The drain select transistor DST of each cell string is coupled between the corresponding bit line and the memory cells MC1 to MCn. Drain select transistors of cell strings arranged in the row direction are coupled to drain select lines extending in the row direction. Drain select transistors of cell strings CS11' to CS1m' in the first row are coupled to a first drain select line DSL1. Drain select transistors of cell strings CS21' to CS2m' in the second row are coupled to a second drain select line DSL2.

As a result, the memory block BLK1' of FIG. 4 has an equivalent circuit similar to that of the memory block BLK1 of FIG. 3 except that a pipe transistor PT is excluded from each cell string.

Figure 5:
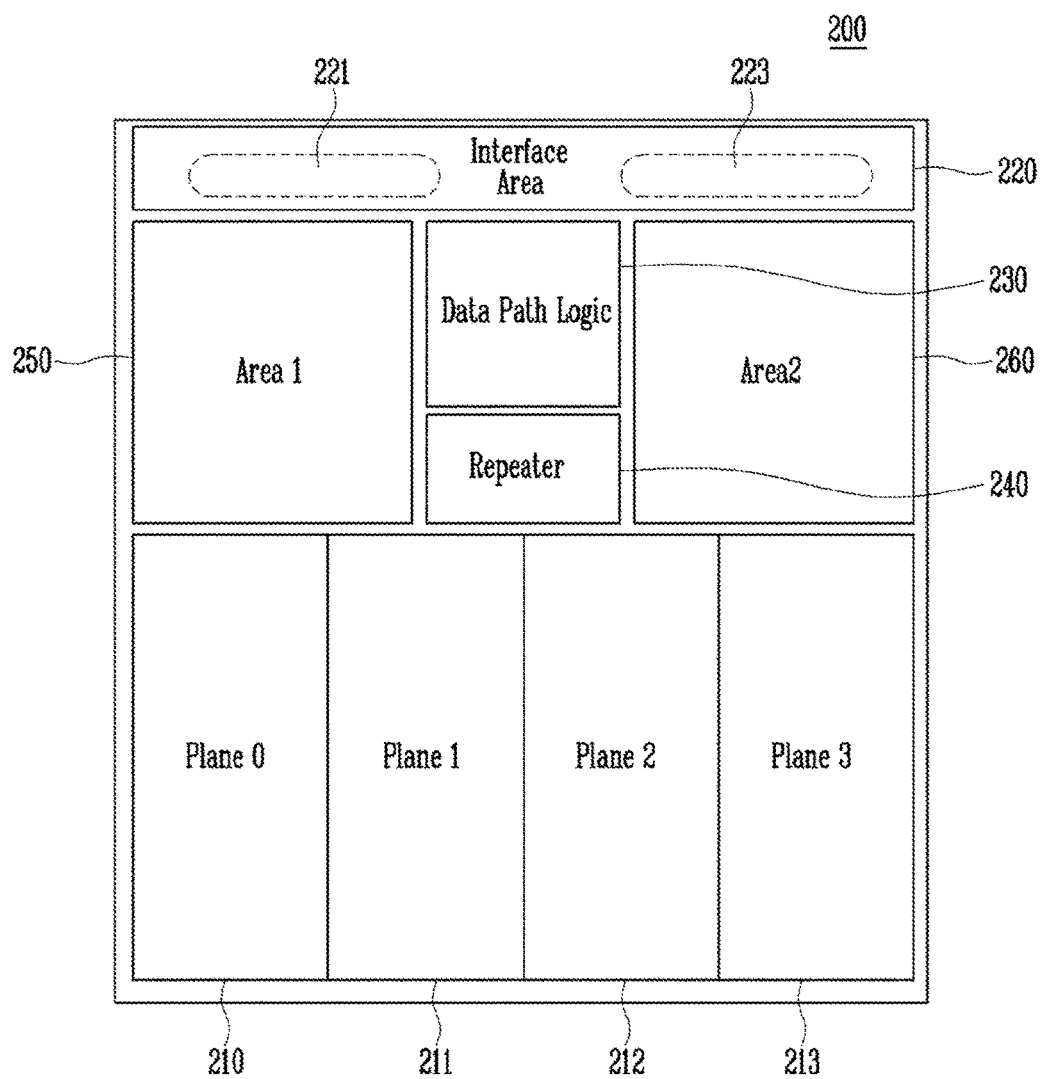
FIG. 5 is a diagram illustrating an internal layout of a typical semiconductor memory device.

FIG. 5 is a diagram illustrating an internal layout of a typical semiconductor memory device 200.

Referring to FIG. 5, the conventional semiconductor memory device 200 includes a plurality of memory planes 210, 211, 212, and 213. Each of the memory planes 210, 211, 212, and 213 may include a plurality of memory blocks. Each of the memory planes 210, 211, 212, and 213 may form a memory cell array. Therefore, each memory plane 210, 211, 212, 213 may correspond to the memory cell array 110 of FIG. 2. Thus, an area taken by the memory planes 210, 211, 212, and 213 may be designated as a "memory cell array area". In FIG. 5, there is illustrated an embodiment in which the memory cell array area includes four memory planes. However, the number of memory planes included in the memory cell array is not limited to this, and the number of memory planes included in the memory cell array area may be changed in various ways.

A peripheral area may be formed adjacent to one side of the memory cell array area. The peripheral area may include a data path logic area 230, a repeater area 240, a first area 250, a second area 260, and so forth. An interface area 220 may be formed adjacent to one side of the peripheral area.

The interface area 220 may receive a control signal and data which are inputted from an external device provided outside the semiconductor memory device 200. For this operation, a data input/output pad and a pad for receiving a control signal may be formed in the interface area 220. Although not shown in FIG. 5, the interface area 220 may include a control circuit, an ESD circuit, a clamp circuit, and so forth.

The data path logic area 230 may be disposed between the interface area 220 and the memory cell array area. Typically, the data path logic area 230 may include a deserializer and a serializer, and may transmit data received from the interface area to the memory cell array area, and transmit data read from the memory cell array area to the interface area. The configuration of the interface area will be described in detail later with reference to FIG. 6.

The repeater area 240 may be disposed between the data path logic area 230 and the memory cell array area. A repeater formed in the repeater area 240 may function to transmit data between the data path logic area 230 and the memory cell array area.

Other circuits for operation of the semiconductor memory device 200 may be formed in the first area 250 and the second area 260. For example, the control logic 130 and the voltage generator 122 shown in FIG. 2 may be formed in the first area 250 or the second area 260.

According to the typical internal layout of the semiconductor memory device, the data path logic area 230 may include a deserializer and a serializer for data transmission. A combination of the deserializer and the serializer may also be designated as "SerDes device", and may be a component configured to receive data from the data input/output pad included in the interface area 220 or output data to the data input/output pad. In more detail, the SerDes device may be configured to time-division multiplex or time-division demultiplex data before transmitting the data. Because the SerDes device is included in the data path logic area 230, the surface area taken by the peripheral area including the data path logic area 230 is increased. Therefore, it is difficult to reduce the size of the chip to which the semiconductor memory device 200 is mounted. The interface area 220 may include the foregoing pads, the control circuit, the ESD circuit, a clamp circuit, etc. Recently, as a capacitor is removed, surplus areas 221 and 223 may be formed in the interface area 220. In the semiconductor memory device in accordance with the present disclosure, the SerDes device is disposed in the surplus areas 221 and 223 in the interface area 220, so that the surface area taken by the peripheral area may be reduced, whereby the overall size of the semiconductor memory device may be reduced.

Figure 6:
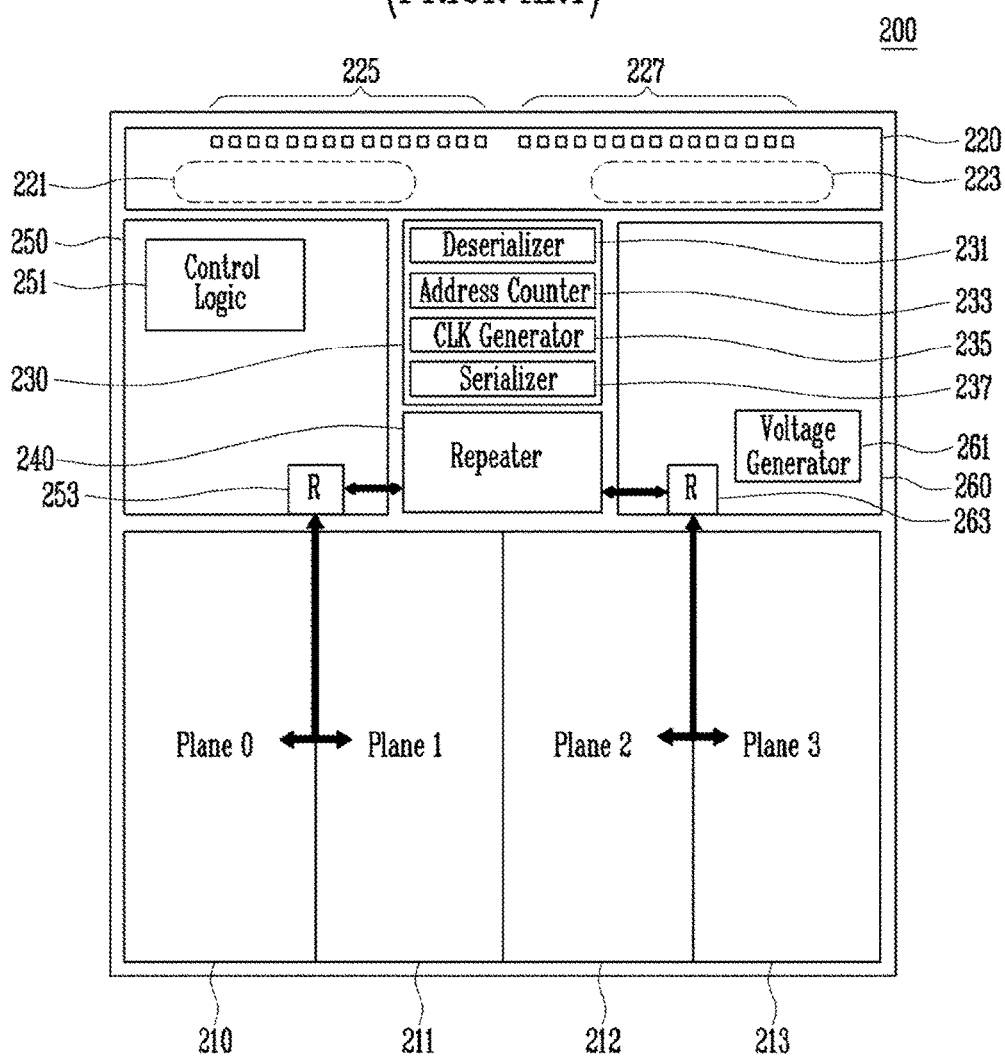
FIG. 6 is a diagram illustrating in more detail the internal layout of the semiconductor memory device of FIG. 5.

FIG. 6 is a diagram illustrating in more detail the internal layout of the semiconductor memory device of FIG. 5.

Referring to FIG. 6, with regard to the internal layout of the semiconductor memory device 200, there is illustrated a layout of the interface area 220, the data path logic area 230, the first area 250, and second area 260. The memory planes 210, 211, 212, and 213 included in the memory cell array are illustrated in the same manner as that of FIG. 5; therefore, a repetitive explanation thereof will be omitted.

As described above, the interface area 220 may include a plurality of pads 225 and 227. The pads 225 and 227 may include data input/output pads. In an embodiment, eight data input/output pads designated as DQ0 to DQ7 may be included in the pads 225 and 227. In addition, the pads 225 and 227 may also include a pad for transmitting/receiving a control signal.

The data path logic area 230 may include a deserializer 231, an address counter 233, a clock generator 235, and a serializer 237. As described above, the deserializer 231 and the serializer 237 are designated as a SerDes device and may transmit data inputted through the data input/output pads to the memory planes 210, 211, 212, and 213 in the memory cell array area, or output data received from the memory planes 210, 211, 212, and 213 to the data input/output pads. The address counter 233 may generate an internal address for an internal operation of the semiconductor memory device 200. The clock generator 235 may generate an internal clock for an internal operation of the semiconductor memory device 200.

A control logic 251 may be formed in the first area 250. A voltage generator 261 may be formed in the second area 260. However, this layout is made for illustrative example, and a detailed layout of the control logic 251 and the voltage generator 261 may be changed in the first area 250 and the second area 260.

Referring to FIG. 6, data transmission from the repeater area 240 is designated by the arrows. If data is inputted through the data input/output pads in the interface area 220, the data is transmitted to the data path logic 230. The data is processed by the SerDes device and then transmitted to the repeater area 240. The repeater area 240 may transmit data to a repeater 253 in the first area 250 or a repeater 263 in the second area 260. The repeater 253, 263 may transmit the received data to the memory planes 210, 211, 212, and 213 in the memory cell array area. Data transmitted from the memory planes 210, 211, 212, and 213 may be transmitted to the data input/output pad of the interface area 220 in a reverse direction of the above-mentioned process.

As described above, in the semiconductor memory device in accordance with an embodiment of the present disclosure, unlike that of FIG. 6, the SerDes device, i.e., the serializer 237 and the deserializer 231, are disposed in the surplus areas 221 and 223 in the interface area 220. Hence, the size of the semiconductor memory device may be reduced. Consequently, the production cost of the semiconductor memory device may also be reduced.

Figure 7:
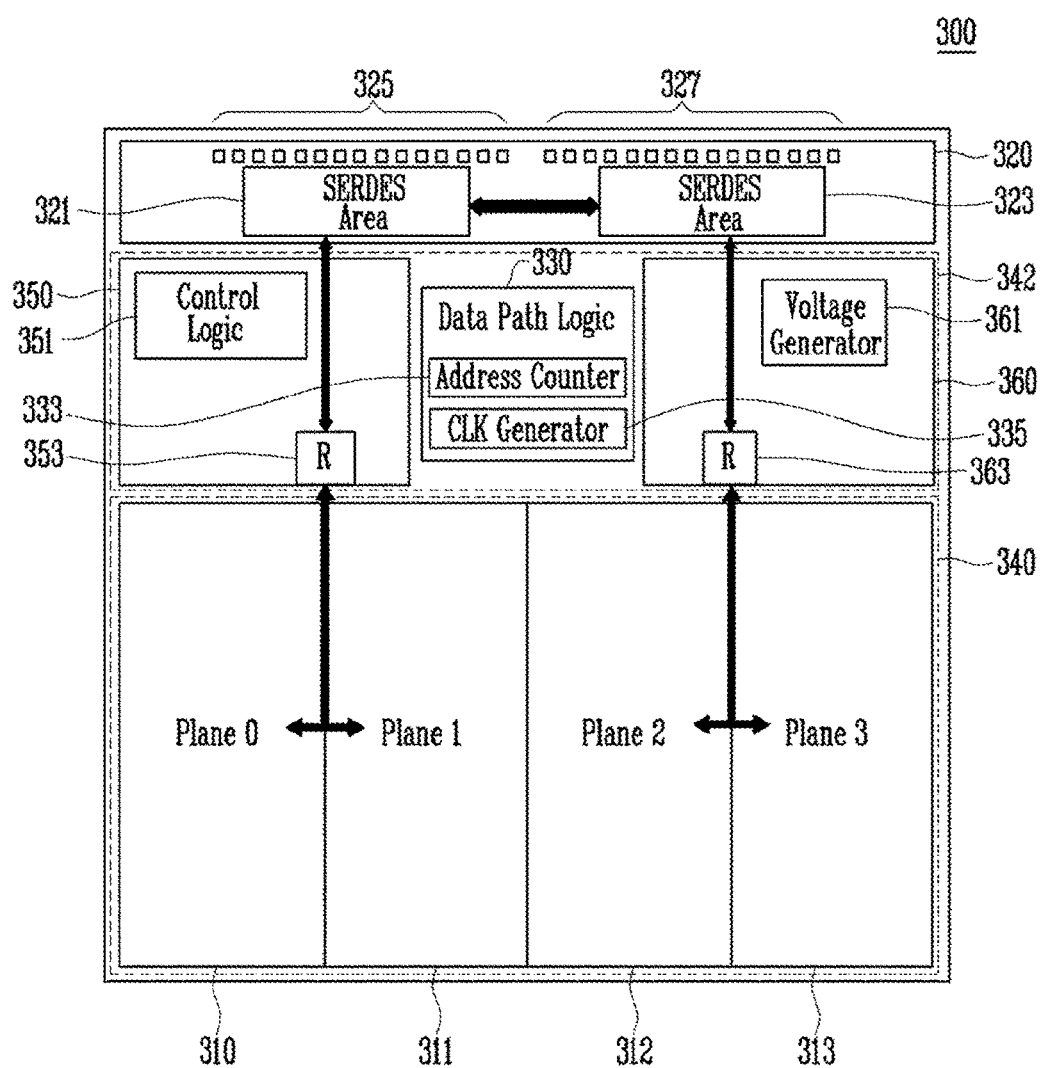
FIG. 7 is a diagram illustrating an internal layout of a semiconductor memory device in accordance with an embodiment of the present disclosure.

FIG. 7 is a diagram illustrating an internal layout of a semiconductor memory device 300 in accordance with an embodiment of the present disclosure.

Referring to FIG. 7, the semiconductor memory device 300 in accordance with an embodiment of the present disclosure may include a memory cell array area 340 having memory planes 310, 311, 312, and 313, a peripheral area 342, and an interface area 320. The peripheral area 342 may be disposed between the memory cell array area 340 and the interface area 320, and may include a data path logic area 330, a first area 350, and a second area 360.

In a similar manner as the device of FIG. 6, the first area 350 may include a control logic 351 and a repeater 353, and the second area 360 may include a voltage generator 361 and a repeater 363. The data path logic area 330 may include an address counter 333 and a clock generator 335. Further, the data path logic area 330 may be disposed between the first area 350 and the second area 360.

Unlike the device shown in FIG. 6, the data path logic area 330 shown in FIG. 7 does not include a deserializer and a serializer, i.e., SerDes device. Instead, the interface area 320 may include SerDes areas 321 and 323 and a deserializer and the serializer may be formed in the SerDes areas 321 and 323. In FIG. 7, the thick arrow represents a data transfer path. In other words, data inputted through a data input/output pad of the pads 325 and 327 in the interface area 320 may be processed by the at least one SerDes device formed in the SerDes areas 321 and 323 and then transmitted to the repeaters 353 and 363. The repeaters 353 and 363 may transmit the received data to the memory planes 310, 311, 312, and 313.

Therefore, the surface area of the data path logic area 330 may be reduced, and areas which had been surplus areas in the conventional art may be used as the SerDes areas 321 and 323, so that the area taken by the interface area 320 may be maintained as it is. As a result, the surface area of the peripheral area is reduced, whereby the overall size of the semiconductor memory device may also be reduced.

Figure 8A:
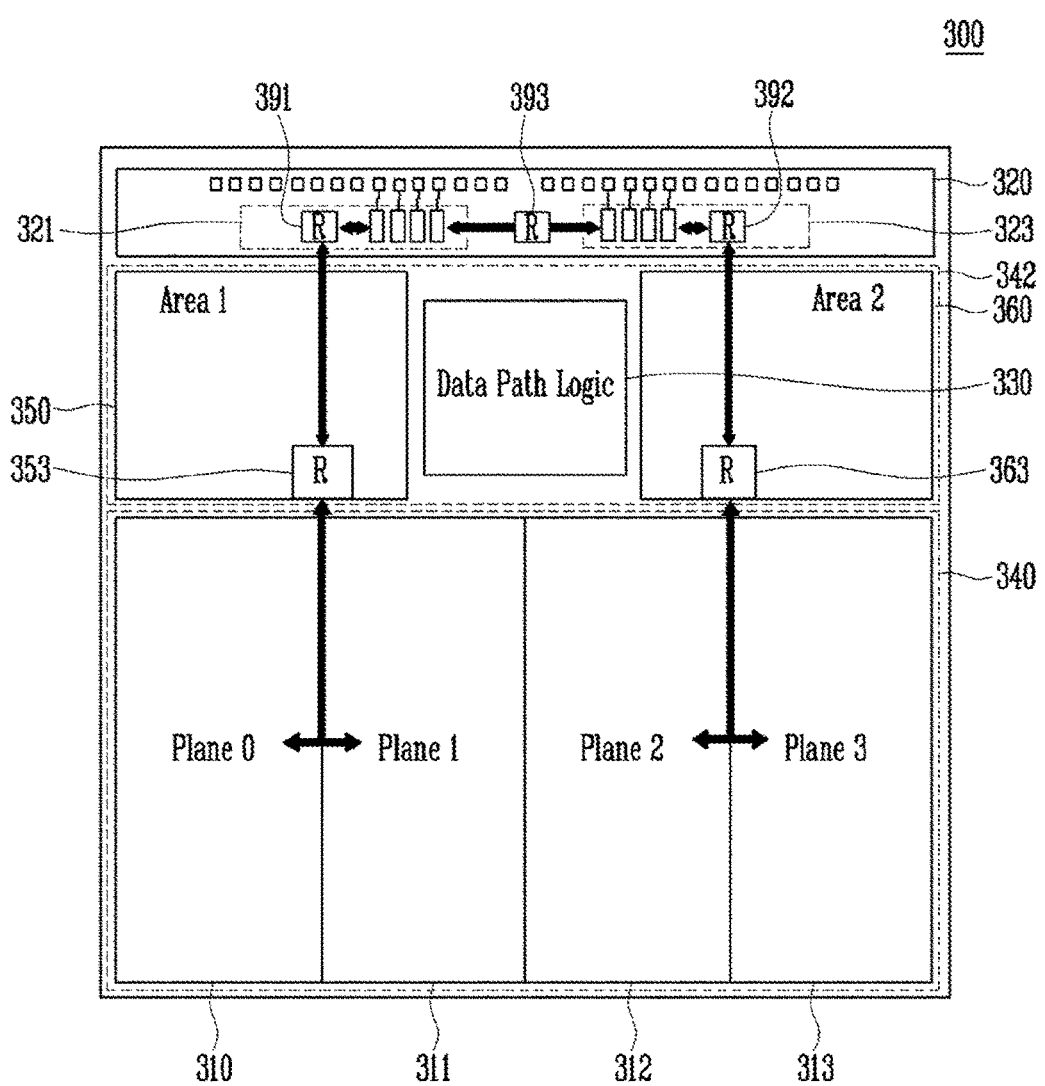
FIG. 8A is a diagram illustrating in more detail the internal layout of the semiconductor memory device of FIG. 7.
Figure 8B:
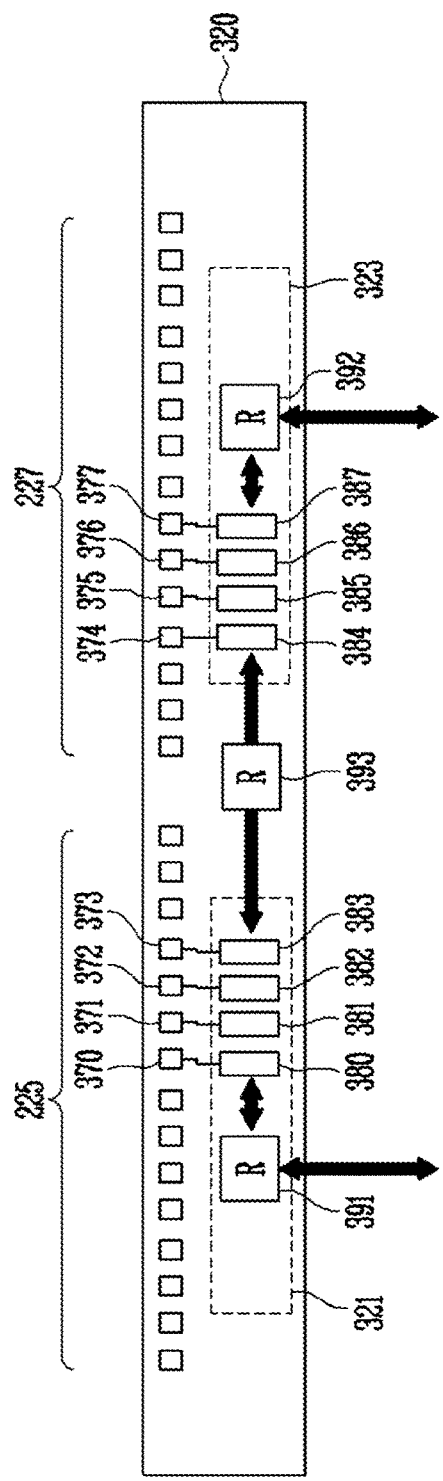
FIG. 8B is a diagram illustrating in more detail an interface area of FIG. 8A.

FIG. 8A is a diagram illustrating in more detail an internal layout of the semiconductor memory device 300 of FIG. 7. FIG. 8B is a diagram illustrating in more detail an interface area 320 of FIG. 8A. Hereinafter, the internal layout of the semiconductor memory device will be described with reference to both FIGS. 8A and 8B.

Referring to FIGS. 8A and 8B, portions of the internal layout other than the interface area 320 are the same as those illustrated in FIG. 7; therefore, a repetitive explanation thereof will be omitted.

The interface area 320 may include SerDes areas 321 and 323. The pads 225 and 227 may include eight data input/output pads 370, 371, 372, 373, 374, 375, 376, and 377. The SerDes areas 321 and 323 may include a plurality of SerDes devices 380, 381, 382, 383, 384, 385, 386, and 387. In an embodiment, although as shown in FIGS. 8A and 8B the number of data input/output pads is greater than the number of SerDes devices 380, 381, 382, 383, 384, 385, 386, and 387, the number of SerDes devices 380, 381, 382, 383, 384, 385, 386, and 387 may be the same as that of data input/output pads 370, 371, 372, 373, 374, 375, 376, and 377 so that the SerDes devices 380, 381, 382, 383, 384, 385, 386, and 387 may be respectively coupled to the data input/output pads 370, 371, 372, 373, 374, 375, 376, and 377 in a one-to-one manner. However, the embodiments of the present disclosure are not limited to this. For example, the number of SerDes devices included in the SerDes areas may differ from that of data input/output pads. In an embodiment, as shown in FIGS. 8A and 8B, the SerDes areas 321 and 323 including the SerDes devices 380, 381, 382, 383, 384, 385, 386, and 387 may be formed in an area adjacent to the data input/output pads 370, 371, 372, 373, 374, 375, 376, and 377, and each SerDes device 380, 381, 382, 383, 384, 385, 386, and 387 may be coupled with a corresponding data input/output pad 370, 371, 372, 373, 374, 375, 376, 377. However, the embodiments of the present disclosure are not limited to this. For example, the SerDes devices may be formed in an area which is not adjacent to the data input/output pads. In this case, although the SerDes devices are not disposed adjacent to the corresponding data input/output pads, the SerDes devices may be coupled with corresponding data input/output pads by a wiring connection. In other words, although the SerDes areas 321 and 323 including the SerDes devices 380, 381, 382, 383, 384, 385, 386, and 387 may be disposed adjacent to the data input/output pads 370, 371, 372, 373, 374, 375, 376, and 377, the SerDes areas 321 and 323 may be disposed at positions spaced apart from the data input/output pads in some embodiments.

The SerDes areas 321 and 323 may respectively include repeaters 391 and 392. The interface area 320 may further include a repeater 393 which is not disposed in either SerDes area 321 and 323. Although not directly shown in FIGS. 8A and 8B, the SerDes devices 380, 381, 382, 383, 384, 385, 386, and 387 may be coupled with the corresponding repeaters 391, 392, and 393 through lines.

Of data inputted to the data input/output pads 370, 371, 372, and 373 disposed at the left side of the interface area 320, data to be transmitted to the memory planes 312 and 313 may be processed by the SerDes devices 380, 381, 382, and 383 of the SerDes area 321 disposed adjacent to the data input/output pads 370, 371, 372, and 373, and then transmitted to the repeater 392 through the repeater 393. The data may then be transmitted to the memory planes 312 and 313 through the repeater 363. Of the data inputted to the data input/output pads 370, 371, 372, and 373 disposed at the left side of the interface area 320, data to be transmitted to the memory planes 310 and 311 may be processed by the SerDes devices 380, 381, 382, and 383 of the SerDes area 321 disposed adjacent to the data input/output pads 370, 371, 372, and 373, and then transmitted to the repeater 391. The data may then be transmitted to the memory planes 310 and 311 through the repeater 353.

Of data inputted to the data input/output pads 374, 375, 376, and 377 disposed at the right side of the interface area 320, data to be transmitted to the memory planes 310 and 311 may be processed by the SerDes devices 384, 385, 386, and 387 of the SerDes area 323 disposed adjacent to the data input/output pads 374, 375, 376, and 377, and then transmitted to the repeater 391 through the repeater 393. The data may then be transmitted to the memory planes 310 and 311 through the repeater 353. Of the data inputted to the data input/output pads 374, 375, 376, and 377 disposed at the right side of the interface area 320, data to be transmitted to the memory planes 312 and 313 may be processed by the SerDes devices 384, 385, 386, and 387 of the SerDes area 323 disposed adjacent to the data input/output pads 374, 375, 376, and 377, and then transmitted to the repeater 392. The data may then be transmitted to the memory planes 312 and 313 through the repeater 363. Accordingly, the interface area 320 may include SerDes areas 321 and 323 which may transmit data inputted through the data input/output pads 370, 371, 372, 373, 374, 375, 376, and 377 to the memory cell array area 340. Further, the interface area 320 may include SerDes areas 321 and 323 which may output data received from the memory cell array area 340 through the data input/output pads 370, 371, 372, 373, 374, 375, 376, and 377.

However, the layout of the data input/output pads, the layout of the SerDes devices, and the layout of the repeaters that have been described above are only for illustrative purposes; therefore, the layouts may be changed, as needed. For example, the SerDes devices do not have to be disposed adjacent to the data input/output pads, but may be disposed in a surplus area formed in the interface area 320. As such, in the present disclosure, the surface area taken by the data path logic area 330 may be reduced, and areas which have been surplus areas in the conventional art may be used as the SerDes areas 321 and 323, so that the surface area taken by the interface area 320 may be maintained as it is. As a result, the surface area taken by the peripheral area is reduced, whereby the overall size of the semiconductor memory device may be reduced.

Figure 9:
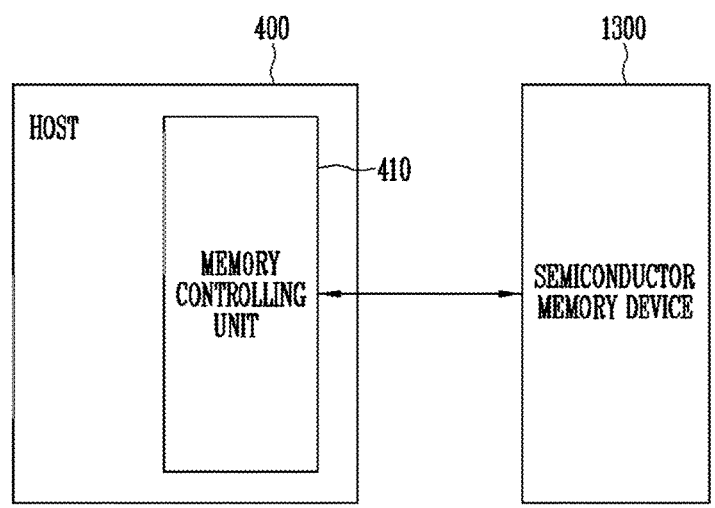
FIG. 9 is a block diagram illustrating a connection between a semiconductor memory device and a host in accordance with an embodiment of the present disclosure.

FIG. 9 is a block diagram illustrating a connection between a semiconductor memory device 1300 and a host 400 in accordance with an embodiment of the present disclosure. Referring to FIG. 9, the semiconductor memory device 1300 possibly does not include an internal controller, unlike the memory system 1000 shown in FIG. 10. Therefore, the semiconductor memory device 1300 may be generally managed by the host 400. In the case where the semiconductor memory device 1300 shown in FIG. 9 is implemented as a NAND flash device, a memory system shown in FIG. 9 may be designated as "raw NAND flash device". The term "raw NAND flash device" may refer to a memory device or package which may be generally managed by a memory controlling unit 410 of the host 400 which is embodied outside the package including the semiconductor memory device. The memory controlling unit 410 in the host 400 may perform memory management and access functions which are performed by a controller 1200 which will be described later herein.

Figure 10:
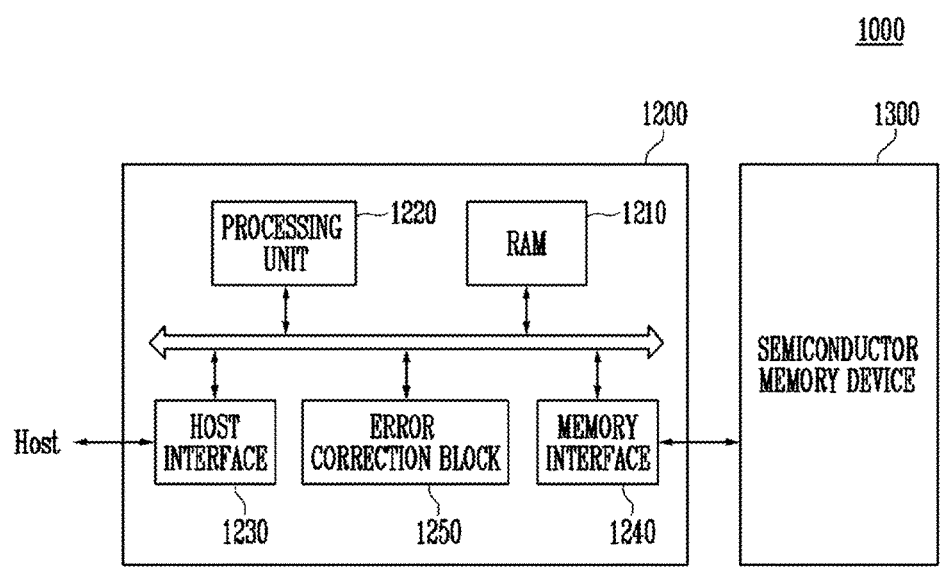
FIG. 10 is a block diagram illustrating a memory system including a semiconductor memory device.

FIG. 10 is a block diagram illustrating a memory system 1000 including a semiconductor memory device.

Referring FIG. 10, a memory system 1000 includes a semiconductor memory device 1300 and the controller 1200.

The semiconductor memory device 1300 may have the same configuration and operation as those of the semiconductor memory device described with reference to FIG. 2 or FIGS. 7 and 8. Hereinafter, repetitive explanations will be omitted.

The controller 1200 is coupled to a host Host and the semiconductor memory device 1300. The controller 1200 may access the semiconductor memory device 100 in response to a request from the host Host. For example, the controller 1200 may control read, write, remove, and background operations of the semiconductor memory device 1300. The controller 1200 may provide an interface between the host Host and the semiconductor memory device 1300. The controller 1200 may drive firmware for controlling the semiconductor memory device 1300. Unlike the embodiment illustrated in FIG. 9 in which the semiconductor memory device 1300 is coupled to the memory controlling unit 410 of the host 400 without using a controller, the semiconductor memory device 1300 of FIG. 10 may be controlled by the controller 1200, and the controller 1200 may be coupled to the host.

The controller 1200 includes a random access memory (RAM) 1210, a processing unit 1220, a host interface 1230, a memory interface 1240, and an error correction block 1250.

The RAM 1210 is used as at least one of an operating memory for the processing unit 1220, cache memory between the semiconductor memory device 1300 and the host, and buffer memory between the semiconductor memory device 1300 and the host.

The processing unit 1220 controls the overall operation of the controller 1200. The processing unit 1220 may control read, program, erase, and background operations of the semiconductor memory device 1000. The processing unit 1220 may drive firmware for controlling the semiconductor memory device 100. The processing unit 1220 may perform a function of a flash translation layer (FTL). The processing unit 1220 may translate a logical block address (LBA), provided by the host, into a physical block address (PBA) through the FTL. The FTL may receive the LBA using a mapping table and translate the LBA into the PBA. Examples of an address mapping method performed through the FTL may include various methods according to a mapping unit. Representative address mapping methods include a page mapping method, a block mapping method, and a hybrid mapping method.

The processing unit 1220 may randomize data received from the host Host. For example, the processing unit 1220 may use a randomizing seed to randomize data received from the host Host. The randomized data is provided, as data to be stored, to the semiconductor memory device 1300 and is then programmed in the memory cell array.

The processing unit 1220 may derandomize data received from the semiconductor memory device 1300 during a read operation. For example, the processing unit 1220 may use a derandomizing seed to derandomize data received from the semiconductor memory device 1300. Derandomized data may be output to the host Host.

In an embodiment, the processing unit 1220 may drive software or firmware to perform the randomizing or derandomizing operation.

The host interface 1230 includes a protocol for performing data exchange between the host Host and the controller 1200. In an embodiment, the controller 1200 may be configured to communicate with the host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol, a private protocol, and the like.

The memory interface 1240 may interface with the semiconductor memory device 1300. For example, the memory interface 1240 includes a NAND interface or a NOR interface.

The error correction block 1250 may use an error correcting code (ECC) to detect and correct an error in data received from the semiconductor memory device 1300. The error correction block 1250 may correct errors from read page data using an ECC. The error correction block 1250 may correct errors using a low density parity check (LDPC) code, a Bose, Chaudhri, Hocquenghem (BCH) Code, a turbo code, a Reed-Solomon code, a convolution code, a recursive systematic code (RSC), or coded modulation such as trellis-coded modulation (TCM), block coded modulation (BCM), or hamming code.

During a read operation, the error correction block 1250 may correct errors from read page data. When a number of error bits exceeding the number of correctable bits are included in the read page data, decoding may fail. When a number of error bits less than or equal to the number of correctable bits are included in the page data, decoding may succeed. A success in decoding indicates that the corresponding read command has passed. A failure in decoding indicates that the corresponding read command has failed. When decoding succeeds, the controller 1200 may output error-corrected page data to the host.

The controller 1200 and the semiconductor memory device 1300 may be integrated into a single semiconductor device. In an embodiment, the controller 1200 and the semiconductor memory device 1300 may be integrated into a single semiconductor device to form a memory card. For example, the controller 1200 and the semiconductor memory device 1300 may be integrated into a single semiconductor device and form a memory card such as a personal computer memory card international association (PCM-CIA), a compact flash card (CF), a smart media card (SMC), a memory stick multimedia card (MMC, RS-MMC, or MMCmicro), a SD card (SD, miniSD, microSD, or SDHC), or a universal flash storage (UFS).

The controller 1200 and the semiconductor memory device 1300 may be integrated into a single semiconductor device to form a solid state drive (SSD). The SSD includes a storage device formed to store data in a semiconductor memory. When the memory system is used as the SSD, an operation speed of the host Host coupled to the memory system 2000 may be phenomenally improved.

In an embodiment, the memory system may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, one of various elements for forming a computing system, or the like.

In an embodiment, the semiconductor memory device 1300 or the memory system 1000 may be embedded in various types of packages. For example, the semiconductor memory device 1300 or the memory system 1000 may be packaged in a type such as a Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), or the like.

Figure 11:
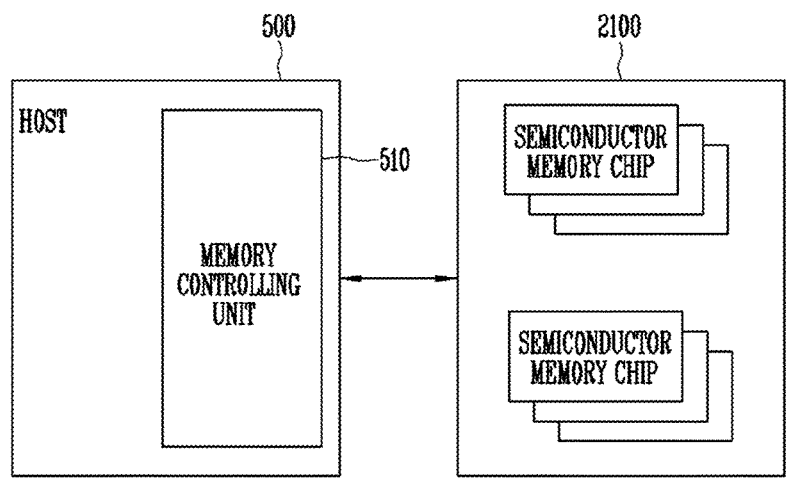
FIG. 11 is a block diagram illustrating an example application of the system of FIG. 9.

FIG. 11 is a block diagram illustrating an example of application of the system of FIG. 9.

Referring to FIG. 11, a semiconductor memory device 2100 includes a plurality of semiconductor memory chips. The semiconductor memory chips may be divided into a plurality of groups. The semiconductor memory device 2100 may communicate with a host 500 without using a controller. In detail, the memory controlling unit 510 of the host 500 may communicate with the semiconductor memory device 2100. The host 500 may control semiconductor memory chips of the semiconductor memory device 2100 through the memory controlling unit 510. Each semiconductor memory chip may have the same configuration and operation as those of an embodiment of the semiconductor memory device 1300 described with reference to FIG. 9.

Figure 12:
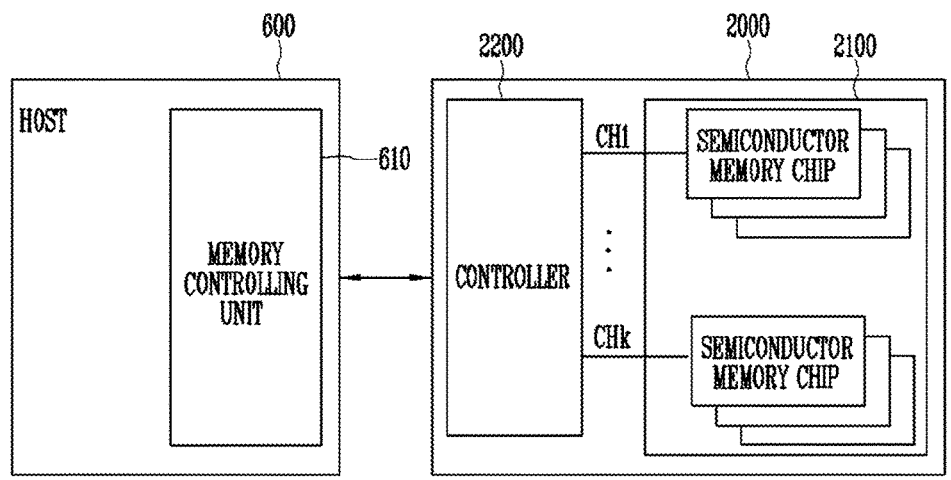
FIG. 12 is a block diagram illustrating an example application of the memory system of FIG. 10.

FIG. 12 is a block diagram showing an example 2000 of an application of the memory system of FIG. 10.

Referring to FIG. 12, the memory system 2000 includes a semiconductor memory device 2100 and a controller 2200. The semiconductor memory device 2100 includes a plurality of memory chips. The semiconductor memory chips may be divided into a plurality of groups. The memory system 2000 may communicate with a host 600. In detail, a memory controlling unit 610 of the host 600 may communicate with the controller 2200 of the memory system 2000. The host 600 may control the memory system 2000 through the memory controlling unit 610. In detail, the controller 2200 of the memory system 2000 may control the semiconductor memory device 2100 based on a command, data, or the like received from the host 600.

In FIG. 12, it is illustrated that the plurality of groups respectively communicates with the controller 2200 through first to k-th channels CH1 to CHk. Each semiconductor memory chip may have the same configuration and operation as those of an embodiment of the semiconductor memory device 1300 described with reference to FIG. 10.

Each group may communicate with the controller 2200 through one common channel. The controller 2200 has the same configuration as that of the controller 1200 described with reference to FIG. 10 and may control a plurality of memory chips of the semiconductor memory device 2100 through the plurality of channels CH1 to CHk.

In FIG. 12, a plurality of semiconductor memory chips has been illustrated as being coupled to each channel. However, it will be understood that the memory system 2000 may be modified into a configuration such that a single memory chip is coupled to each channel.

Referring to FIGS. 11 and 12, compared to the embodiment of FIG. 11 in which the semiconductor memory device 2100 is directly coupled with the host 500, the embodiment of FIG. 12 is configured such that the semiconductor memory device 2100 is coupled to the controller 2200, and the controller 2200 is coupled with the host 600. Compared to the memory controlling unit 510 of FIG. 11, the memory controller 610 of FIG. 12 may be designated as "managed memory controlling unit".

Figure 13:
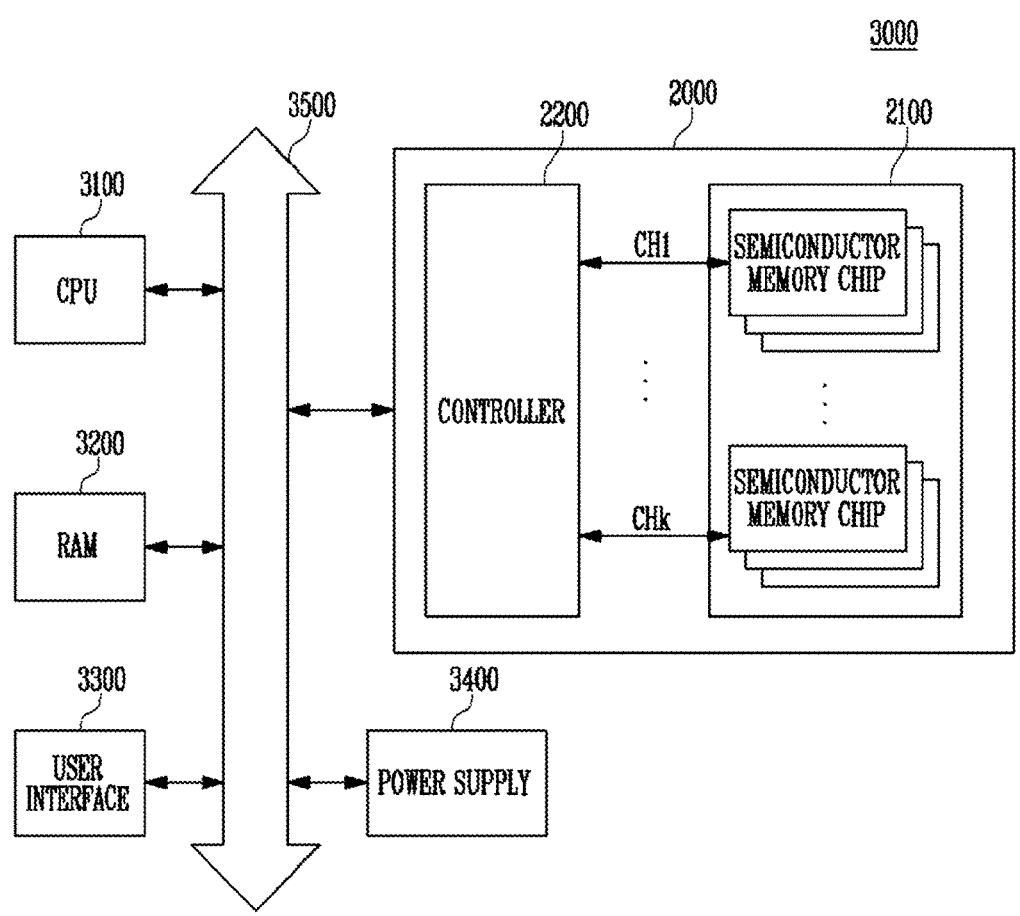
FIG. 13 is a block diagram illustrating a computing system including the memory system illustrated with reference to FIG. 12.

FIG. 13 is a block diagram illustrating a computing system including the memory system illustrated with reference to FIG. 12.

Referring to FIG. 13, the computing system 3000 may include a central processing unit 3100, a RAM 3200, a user interface 3300, a power supply 3400, a system bus 3500, and a memory system 2000.

The memory system 2000 is electrically coupled to the CPU 3100, the RAM 3200, the user interface 3300, and the power supply 3400 through the system bus 3500. Data provided through the user interface 3300 or processed by the CPU 3100 may be stored in the memory system 2000.

In FIG. 13, the semiconductor memory device 2100 has been illustrated as being coupled to the system bus 3500 through the controller 2200. However, as shown in FIG. 11, the semiconductor memory device 2100 may be directly coupled to the system bus 3500. The function of the controller 2200 may be performed by the CPU 3100 and the RAM 3200.

In FIG. 13, the memory system 2000 described with reference to FIG. 12 is illustrated as being used. However, the memory system 2000 may be replaced with the memory system 1000 described with reference to FIG. 10. In an embodiment, the computing system 3000 may include both the memory systems 1000 and 2000 described with reference to FIGS. 12 and 10.

Various embodiments of the present disclosure may provide a semiconductor memory device capable of reducing the production cost, and reducing the size of a chip.

Although embodiments of the present disclosure have been disclosed, those skilled in the art will appreciate that various modifications, additions and substitutions are possible, without departing from the scope and spirit of the present disclosure.

Therefore, the scope of the present disclosure must be defined by the appended claims and equivalents of the claims rather than by the description preceding them.

In the above-discussed embodiments, all steps may be selectively performed or one or more steps may be skipped. In addition, the steps in each embodiment may not be always performed in regular order. Furthermore, the embodiments disclosed in the present specification and the drawings aim to help those with ordinary knowledge in this art more clearly understand the present disclosure rather than aiming to limit the bounds of the present disclosure. In other words, one of ordinary skill in the art to which the present disclosure belongs will be able to easily understand that various modifications are possible based on the technical scope of the present disclosure.

Embodiments of the present invention have been described with reference to the accompanying drawings, and specific terms or words used in the description should be construed in accordance with the spirit of the present invention without limiting the subject matter thereof. It should be understood that many variations and modifications of the basic inventive concept described herein will still fall within the spirit and scope of the present disclosure as defined in the appended claims and their equivalents.

What is claimed is:

1. A semiconductor memory device comprising:
a memory cell array area including at least one memory plane;
a peripheral area formed adjacent to one side of the memory cell array area; and
an interface area formed adjacent to one side of the peripheral area, the interface area comprising a plurality of data input/output pads,
wherein the interface area comprises at least one SerDes (serializer/deserializer) area configured to transmit, to the memory cell array area, data inputted through the data input/output pads, or output, through the data input/output pads, data received from the memory cell array area,
wherein the at least one SerDes area includes a first SerDes area and a second SerDes area, where the first SerDes area includes a first repeater and the second SerDes area includes a second repeater;
the interface area includes a third repeater which is not in the first SerDes area or the second SerDes area;
the peripheral area includes a first area which includes a fourth repeater and a second area which includes a fifth repeater; and the memory cell array includes a first memory plane, a second memory plane, a third memory plane, and a fourth memory plane, and wherein data is transferred from the first SerDes area to the second repeater through the third repeater so as to be transferred the third and fourth memory planes through the fifth repeater.

2. The semiconductor memory device according to claim 1, wherein a plurality of SerDes devices are formed in the SerDes area, and each of the SerDes devices comprises a serializer and a deserializer.

3. The semiconductor memory device according to claim 2, wherein the SerDes area is disposed adjacent to the plurality of data input/output pads.

4. The semiconductor memory device according to claim 2, wherein each of the SerDes devices is coupled with a corresponding one of the plurality of data input/output pads.

5. The semiconductor memory device according to claim 4, wherein the interface area comprises at least one repeater, and the repeater is configured to transmit data from the SerDes area to the memory cell array area.

6. The semiconductor memory device according to claim 1, wherein the interface area further comprises pads configured to receive a control signal.

7. The semiconductor memory device according to claim 1, wherein the peripheral area comprises a data path logic area formed between the memory cell array area and the interface area.

8. The semiconductor memory device according to claim 7,
wherein the peripheral area further comprises a first area and a second area formed between the memory cell array area and the interface area, and
wherein the data path logic area is disposed between the first area and the second area.

9. The semiconductor memory device according to claim 8, wherein a control logic configured to control an operation of the semiconductor memory device is formed in any one of the first area and the second area.

10. The semiconductor memory device according to claim 8, wherein a voltage generator configured to generate an internal voltage for an operation of the semiconductor memory device is formed in any one of the first area and the second area.

11. The semiconductor memory device according to claim 7, wherein the data path logic area comprises:
an address counter configured to generate an internal address; and
a clock generator configured to generate an internal clock.

12. A semiconductor memory device comprising:
a memory cell array area including at least one memory plane;
a peripheral area formed adjacent to one side of the memory cell array area; and
an interface area formed adjacent to one side of the peripheral area, the interface area comprising a plurality of data input/output pads,
wherein the interface area comprises at least one SerDes (serializer/deserializer) area configured to transmit, to the memory cell array area, data inputted through the data input/output pads, or output, through the data input/output pads, data received from the memory cell array area,
wherein the at least one SerDes area includes a first SerDes area and a second SerDes area, where the first SerDes area includes a first repeater and the second SerDes area includes a second repeater;
the interface area includes a third repeater which is not in the first SerDes area or the second SerDes area;
the peripheral area includes a first area which includes a fourth repeater and a second area which includes a fifth repeater; and
the memory cell array includes a first memory plane, a second memory plane, a third memory plane, and a fourth memory plane, and
wherein data is transferred from the second SerDes area to the first repeater through the third repeater so as to be transferred to the first and second memory planes through the fourth repeater.

* * * * *